(12) United States Patent
Sander

(10) Patent No.: US 6,580,329 B2
(45) Date of Patent: Jun. 17, 2003

(54) PLL BANDWIDTH SWITCHING

(75) Inventor: Wendell B. Sander, Los Gatos, CA (US)

(73) Assignee: Tropian, Inc., Cupertino, CA (US)

( * ) Notice: Subject to any disclaimer, the term of this patent is extended or adjusted under 35 U.S.C. 154(b) by 40 days.

(21) Appl. No.: 09/834,247

(22) Filed: Apr. 11, 2001

(65) Prior Publication Data

US 2002/0149429 A1 Oct. 17, 2002

(51) Int. Cl.[7] .................................................. H03L 7/85
(52) U.S. Cl. .......................... 331/17; 331/1 A; 331/25; 327/156; 327/157; 327/159
(58) Field of Search ............................... 331/1 A, 8, 10, 331/14, 17, 18, 25, DIG. 2; 327/156–159; 360/51; 375/376; 455/260

(56) References Cited

U.S. PATENT DOCUMENTS 5,448,598 A * 9/1995 Yousefi et al. .............. 375/376

* cited by examiner

*Primary Examiner*—David C. Mis
(74) *Attorney, Agent, or Firm*—Thelen Reid & Priest LLP; Robert E. Krebs

(57) ABSTRACT

The present invention, generally speaking, provides for bandwidth switching of a PLL in a simple, effective manner. In accordance with one embodiment, a phase lock loop includes a controlled oscillator responsive to a control voltage for producing an output signal of some output frequency; a comparator responsive to a feedback signal derived from the output signal and to a reference signal for producing at least one error signal; a charge pump circuit including multiple pairs of unidirectional current sources (or, alternatively, multiple bidirectional current sources); a control circuit responsive to a control signal for activating one or more pairs of unidirectional current sources, at the same time deactivating one or more pairs of unidirectional current sources; and a loop filter responsive to the multiple pairs of unidirectional current sources for producing the control voltage governing the output frequency. In accordance with another embodiment of the invention, a phase lock loop includes a controlled oscillator responsive to a control voltage for producing an output signal of some output frequency; a comparator responsive to a feedback signal derived from the output signal and to a reference signal for producing at least one error signal; a charge pump circuit coupled to a loop filter at at least one circuit node, the loop filter being responsive to at least the charge pump circuit for producing the control voltage; a logic driver coupled to said circuit node through a resistor; and a control circuit responsive to at least one control signal for controlling a state of the logic driver. Preferably, the logic driver is a tri-state device.

2 Claims, 2 Drawing Sheets

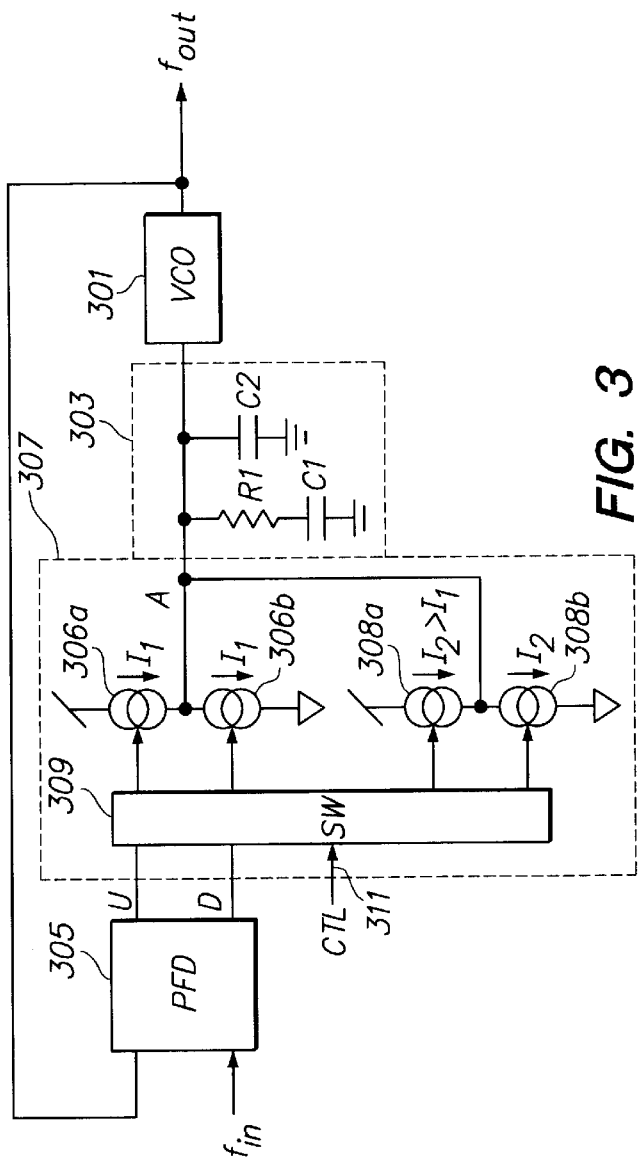
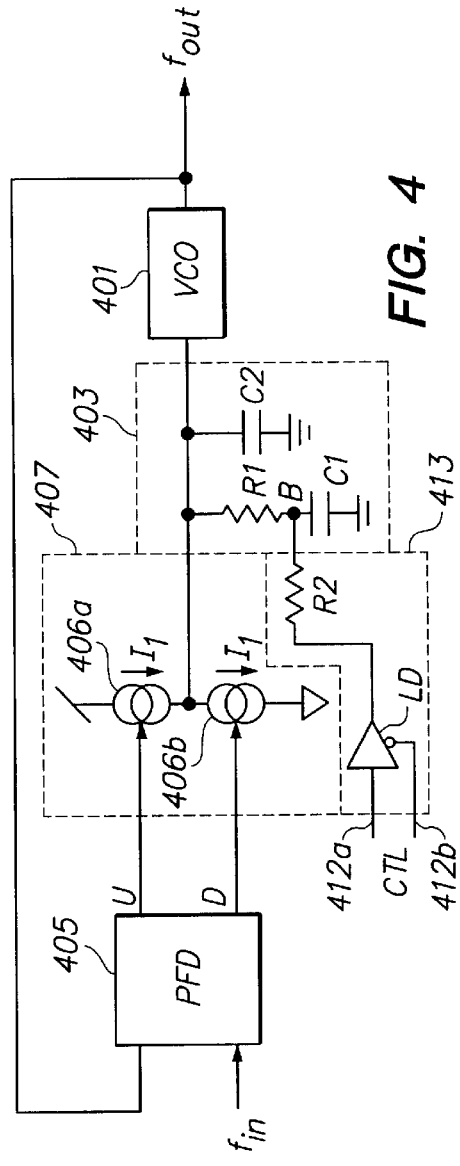

PLL BANDWIDTH SWITCHING

BACKGROUND OF THE INVENTION

1. Field of the Invention

The present invention relates to phase lock loops, more particularly to phase lock loops having both a wide-band mode and a narrow-band mode of operation.

2. State of the Art

Practically all modern signal generators and radio communications equipment use digital frequency synthesizers based on the phase-locked loop (PLL). The realization of the PLL in an integrated circuit has led to the widespread adoption of inexpensive frequency synthesizers. In its application to frequency synthesis (as opposed to signal detection), the input signal-to-noise ratio of the PLL is high, and the PLL serves to lock the output frequency on a multiple of the input frequency.

A PLL consists generally of three parts: a reference frequency input portion, a loop filter portion, and a voltage-controlled oscillator (VCO) portion. The reference frequency portion includes a phase comparator and may include a frequency divider (which may be programmable). The phase comparator compares an output signal of the PLL with the reference frequency itself or the reference frequency divided down, thereby producing an error signal. The loop filter filters the error signal to produce a control signal that is applied to the VCO. During proper operation, the control signal drives the VCO in the proper direction so as to cause the error signal to be driven to zero or nearly zero.

PLLs generally operate in two different modes: acquisition during which the PLL locks onto a particular frequency, and tracking, during which the PLL ensures that it remains locked. Both fast acquisition and accurate tracking are important design objectives. Unfortunately, these design objectives are, in general, conflicting. For fast acquisition, a wide loop bandwidth is desired. For accurate tracking, in the presence of modulation, a narrow loop bandwidth is desired. The disparity between the desired bandwidths in the two modes may be considerable. In cellular applications, for example, when changing channels, a wide loop bandwidth is desired to accomplish the frequency change as quickly as possible. When operating on a single channel, voice data having low frequency content is modulated onto a carrier signal. The PLL attempts in effect to cancel the modulation, which appears to the PLL as frequency drift. To accomplish slow modulation, therefore, a very narrow loop bandwidth is desired, such that the modulation is accomplished outside the PLL bandwidth.

One proposal, "A Fast Locking Scheme for PLL Frequency Synthesizers", National Semiconductor Application Note 1000 (1995), has been to, in narrow-band mode, open the loop entirely during short modulation bursts and to close the loop when modulation is not applied. This approach assumes that, if the loop is opened for only short periods at a time, the drift that may occur during open-loop operation will not be substantial. This solution may be acceptable under certain limited conditions but is not generally applicable.

In the case of a current-mode charge pump loop filter, the required change in current gain is proportional to the square of the required change in bandwidth. Referring more particularly to FIG. 1, a portion of a PLL is shown, including a loop filter 101 and a VCO 111. A charge pump 105 has a first "pump-up" current source 107 connected to inject current into circuit node A, and a second "pump-down" current source 109 connected to withdraw current from the same node. The pump-up current source 107 is connected to a positive supply voltage V+, and the pump-down current source 109 is connected to a negative supply voltage V−. Besides the charge pump 105, there is also connected to node A a capacitor C1 connected to ground and the series combination of a resistor R1 and capacitor C2, connected to ground. A tuning voltage $V_T$ is produced at node A and is input to the VCO 111 to control the frequency of oscillation of the VCO.

The loop bandwidth of the circuit of FIG. 1 may be changed by changing the values of one or both of the capacitors (C1, C2), such that they charge more slowly or more quickly. Changing the values of the capacitors usually requires some form of switching. However, it is also important not to disturb the charge on the capacitors. Switching usually introduces undesirable transients. A preferable way of changing the loop bandwidth, then, is to vary the magnitude of the currents supplied by the current sources (107, 109). To switch from wide to narrow bandwidth, for example, instead of switching in additional capacitors to make the capacitance larger, the current gain would be altered to make the currents smaller.

One known circuit that follows the foregoing approach is shown in FIG. 2 and described in U.S. Pat. No. 5,831,483, incorporated herein by reference. The VCO 1 is supplied with a control signal Vc to produce an oscillation signal $f_o$ having an oscillation frequency that corresponds to the supplied control signal Vc. The variable frequency-divider 2 is supplied with the oscillation signal $f_o$ to produce a frequency-divided signal fv, while the reference signal generator 3 generates a reference signal fr. The frequency-phase comparator 4 is supplied with the frequency-divided signal fv and the reference signal fr to compare frequency/phases between both signals. The frequency-phase comparator 4 outputs a corresponding error signal, up signal or down signal, as a result of the comparison. The charge pump 10 supplies a charge pump signal cp to the loop filter 6 in response to input of the error signal. In other words, the charge pump 10 supplies the loop filter 6 with a charge output when the up signal is active or a discharge output when the down signal is active. The loop filter 6 integrates and smooth the received charge pump signal cp to produce the control signal Vc. The output of the loop filter 6, i.e., the control signal Vc, is fed back to the VCO 1, thus forming the PLL.

When changing frequency, the current-flow control circuit 11 increases the amount of charge/discharge current flow of the charge pump 10 to raise the loop gain, so that the pull-in time (lock-up time) is shortened. After changing the frequency, it reduces the output current of the charge pump 10 so as to secure a stable circuit action.

The foregoing general type of PLL circuit is susceptible to many different realizations. The present invention relates to particularly advantageous realizations of the same.

SUMMARY OF THE INVENTION

The present invention, generally speaking, provides for bandwidth switching of a PLL in a simple, effective manner. In accordance with one embodiment, a phase lock loop includes a controlled oscillator responsive to a control voltage for producing an output signal of some output frequency; a comparator responsive to a feedback signal derived from the output signal and to a reference signal for producing at least one error signal; a charge pump circuit including multiple pairs of unidirectional current sources (or, alternatively, multiple bidirectional current sources); a control circuit responsive to a control signal for activating one or more pairs of unidirectional current sources, at the same time deactivating one or more pairs of unidirectional current sources; and a loop filter responsive to the multiple pairs of unidirectional current sources for producing the control voltage governing the output frequency. In accordance with another embodiment of the invention, a phase lock loop includes a controlled oscillator responsive to a control voltage for producing an output signal of some output frequency; a comparator responsive to a feedback signal derived from the output signal and to a reference signal for producing at least one error signal; a charge pump circuit coupled to a loop filter at at least one circuit node, the loop filter being responsive to at least the charge pump circuit for producing the control voltage; a logic driver coupled to said circuit node through a resistor; and a control circuit responsive to at least one control signal for controlling a state of the logic driver. Preferably, the logic driver is a tri-state device.

BRIEF DESCRIPTION OF THE DRAWING

The present invention may be further understood from the following description in conjunction with the appended drawing. In the drawing:

FIG. 3 is a circuit diagram of a PLL in accordance with one embodiment of the invention; and FIG. 4 is a circuit diagram of a PLL in accordance with another embodiment of the invention.

DETAILED DESCRIPTION OF THE PREFERRED EMBODIMENTS

Figure 1:
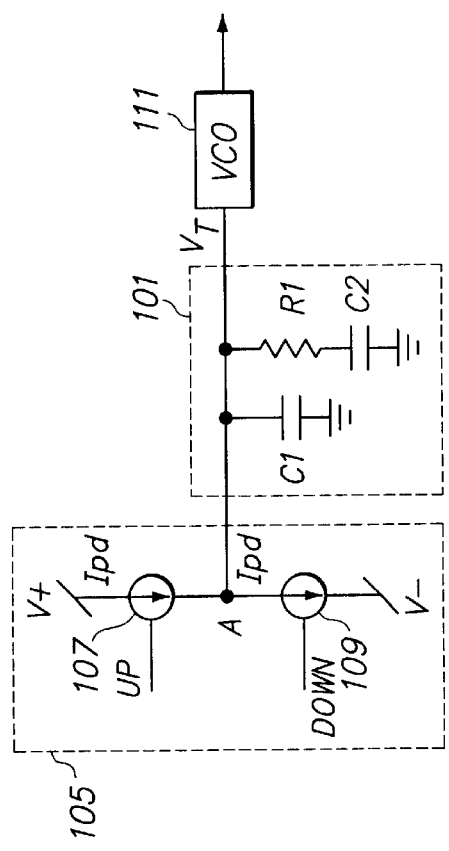
FIG. 1 is a circuit diagram of a portion of a conventional PLL.
Figure 2:
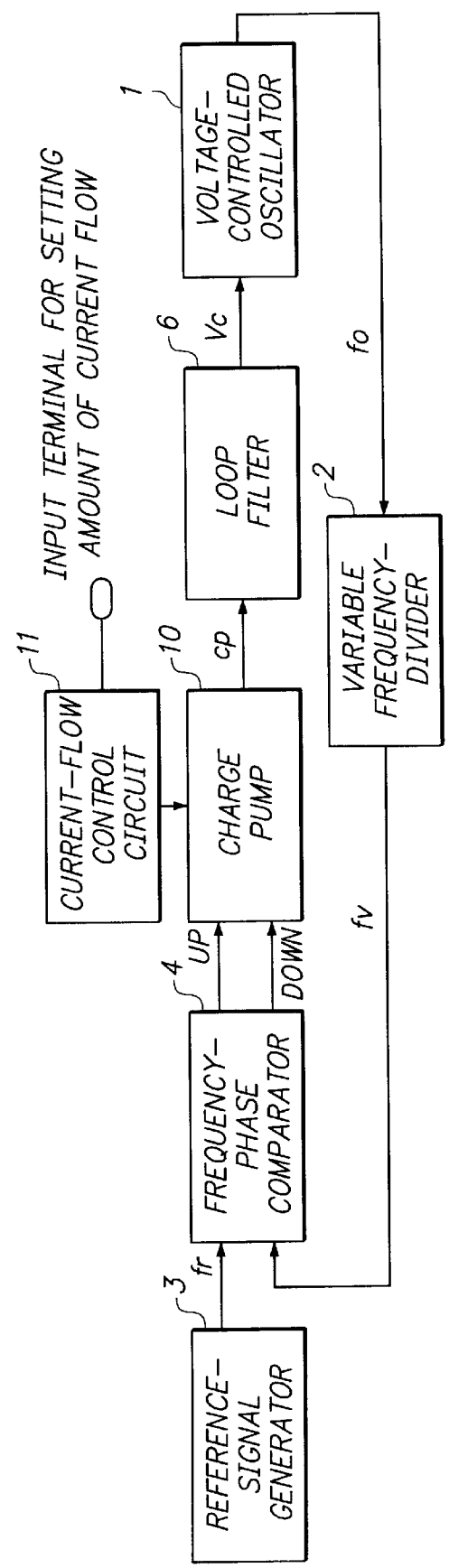
FIG. 2 is a circuit diagram of another conventional PLL.

Referring now to FIG. 3, a circuit diagram is shown of a PLL in accordance with an exemplary embodiment of the invention. A VCO 301 is controlled in accordance with a voltage produced by a loop filter 303, the VCO producing an output signal having a frequency $f_{out}$. This output signal (or a signal derived therefrom by means not shown) is fed back to a phase/frequency detector (PFD) 305, where it is compared with a reference signal $f_{in}$. The PFD produces control signals for a charge pump circuit 307, namely an up signal U and a down signal D, signifying respectively that the output signal should be advanced or retarded.

The loop filter 303 may be conventional and is shown as comprising a "pi" circuit where one of the legs of the circuit is an RC combination R1C1 and the other is a capacitor C2. Any of various suitable loop filter circuits may be used, the details of which are of only minor importance to the present invention.

The charge pump circuit is shown as including two pairs of current sources, 306a/306b and 308a/308b. The current sources 306a/306b produce a current $I_1$; the current sources 308a/308b produce a substantially larger current $I_2$. All of the current sources are connected to a common node A that forms an input signal to the loop filter. The current sources 306a and 308a, when active, "pump up" (raise the voltage at) node A; the current sources 306b and 308b, on the other hand, "pump down" (lower the voltage at) node A. A switch 309 is responsive to a control signal 311 to cause the signals U,D from the PFD to be applied to either the current sources 306a/306b or the current sources 308a/308b.

In operation, during tracking mode, the switch is set such that the signals U,D are applied to the current sources 306a/306b. The loop therefore moves more slowly in accordance with the smaller current $I_1$. During acquisition, the switch is set such that the signals U,D are applied to the current sources 308a/308b. The loop therefore moves more rapidly in accordance with the larger current $I_2$.

Referring to FIG. 4, a circuit diagram is shown of a PLL in accordance with another exemplary embodiment of the invention. A VCO 401, loop filter 403 and PFD 405 are all arranged as in the previous embodiment. A charge pump circuit 407 is conventional, having a single pair of current sources 406a/406b. An auxilliary circuit 413 is provided in the form of a tri-state logic driver LD coupled through a resistor R2 to a node B of the loop filter. Responsive to control signals 412a and 412b, the logic driver assumes one of the following states: an ON state in which it applies a logic high signal to the resistor R2, causing a corresponding current to flow into node B; an OFF state in which it applies a logic low signal to the resistor R2, causing a corresponding current to flow out of node B; a high-impedance (disabled) state in which the logic driver is effectively disconnected from the remainder of the circuit, leaving node B unaffected.

In operation of the embodiment of FIG. 4, during tracking mode, the control signals 411a/411b are set such that the logic driver is disabled. The loop therefore moves relatively slowly in accordance with the current $I_1$. During acquisition, the control signals 411a/411b are set such that the logic driver is enabled and is placed in the ON state or the OFF state in coordination with the signals U,D. In one embodiment, when U is active, the logic driver is placed in the ON state; when D is active, the logic driver is placed in the D state. The loop therefore moves more rapidly in accordance with the combination of the current $I_1$ and the current flowing through the resistor R2.

Note that the approaches of FIG. 3 and FIG. 4 may be used together if desired.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A phase lock loop comprising:

a controlled oscillator responsive to a control voltage for producing an output signal of some output frequency;

a comparator responsive to a feedback signal derived from the output signal and to a reference signal for producing at least one error signal;

a charge pump circuit responsive to said at least one error signal for producing at least one current;

a loop filter coupled to said charge pump circuit at at least one circuit node, the loop filter being responsive to at least the charge pump circuit for producing said control voltage;

a logic driver coupled to said circuit node through a resistor; and a control circuit responsive to at least one control signal for controlling a state of the logic driver.

2. The apparatus of claim 1, wherein the logic driver is a tri-state device.

* * * * *